United States Patent [19]

Sawyer

[11] 4,388,351
[45] Jun. 14, 1983

[54] METHODS OF FORMING A PATTERNED METAL FILM ON A SUPPORT

[75] Inventor: Ernest W. Sawyer, Richmond, Va.

[73] Assignee: Western Electric Company, Inc., New York, N.Y.

[21] Appl. No.: 330,993

[22] Filed: Dec. 15, 1981

Related U.S. Application Data

[63] Continuation of Ser. No. 68,298, Aug. 20, 1979, abandoned.

[51] Int. Cl.$^3$ .............................................. B05D 3/04
[52] U.S. Cl. .................................... 427/304; 427/305; 427/307; 427/98; 427/404; 430/314; 430/315; 430/324; 430/414
[58] Field of Search ............... 430/314, 315, 324, 414; 427/98, 304, 307, 305, 404

[56] References Cited

U.S. PATENT DOCUMENTS

| | | | |
|---|---|---|---|
| Re. 29,015 | 10/1976 | De Angelo et al. ................. | 427/98 |
| 3,347,724 | 10/1976 | Schneble et al. .................... | 427/265 |
| 3,522,085 | 7/1970 | Watanabe .............................. | 427/98 |
| 3,562,038 | 2/1971 | Shipley et al. ....................... | 427/98 |
| 3,573,973 | 4/1971 | Drotar et al. ......................... | 427/98 |
| 3,619,285 | 11/1971 | Feldstein .............................. | 427/98 |
| 3,672,925 | 6/1972 | Feldstein .............................. | 427/98 |
| 3,779,758 | 12/1973 | Polichette ........................... | 430/315 |
| 3,928,663 | 12/1975 | Redmond et al. ................... | 427/304 |
| 3,929,483 | 12/1975 | Wainer et al. ....................... | 430/315 |
| 3,959,523 | 5/1976 | Grunwald et al. .................. | 427/306 |
| 3,982,045 | 9/1976 | Kukanskis ............................ | 427/98 |
| 4,084,023 | 4/1978 | Dafter .................................... | 427/98 |
| 4,107,351 | 8/1978 | James et al. ......................... | 427/304 |
| 4,144,118 | 3/1979 | Stahl ...................................... | 427/98 |
| 4,151,313 | 4/1979 | Wajima et al. ....................... | 427/98 |
| 4,152,477 | 5/1979 | Haruta et al. ........................ | 427/98 |
| 4,169,171 | 9/1979 | Narcus .................................. | 427/404 |

OTHER PUBLICATIONS

Handbook of Thin Film Technology, edited by Leon I. Maissel and Reinhard Glang, McGraw-Hill Book Co., 1970, pp. 7-48 to 7-49.
Electronic News, Nov. 6, 1978, "64K Dynamic RAM-IBM Standard", p. 59.

*Primary Examiner*—Won H. Louie, Jr.
*Attorney, Agent, or Firm*—J. F. Spivak

[57] ABSTRACT

A printed circuit board is formed by forming a negative resist pattern over the surface of a substrate, etching the surface, sensitizing and catalyzing the surface, stripping the negative mask and catalytic layer thereover leaving a positive catalytic circuit pattern on the substrate and electrolessly plating copper over the catalytic image. A preferred variation of this method includes flash plating a thin porous electroless deposit over the catalyzed substrate prior to stripping the resist layer.

2 Claims, 2 Drawing Figures

1(a)

1(b)

1(c)

1(d)

1(e)

2(a)

2(b)

2(c)

2(d)

2(e)

2(f)

METHODS OF FORMING A PATTERNED METAL FILM ON A SUPPORT

This is a continuation, of application Ser. No. 68,298 filed Aug. 20, 1979, now abandoned.

TECHNICAL FIELD

This invention relates to forming a metal pattern on the surface of a substrate and to the products resulting from such methods. More particularly, the present invention relates to methods of forming metal patterns on insulating substrates particularly suitable for the manufacture of high resolution printed circuit boards.

BACKGROUND OF THE INVENTION

It is well known to apply an electroless metal plating to an insulating substrate, such as plastic, by depositing a noble metal, such as palladium, gold or platinum, as an initiator or catalyst for the electroless metal plating onto the surface of the insulating substrate, and then dipping the substrate into an electroless metal plating solution. It is also known to catalyze a surface with a non-noble metal catalytic layer, e.g., Cu, by reduction of a copper compound adsorbed on the surface.

Various techniques have been proposed to form a circuit on the insulating substrate by electroless metal plating for the manufacture of printed circuits on flexible or rigid substrates. Among the methods utilized for forming printed circuit boards is the method disclosed in U.S. Pat. No. 3,929,483 wherein a photoresist is laid down on a surface which is highly absorptive to silver salts. Such a surface is anodized aluminum. The photoresist on the surface is then exposed to light through a negative to obtain a desired circuit pattern. The portions not struck by light are removed by washing in a suitable solvent. This leaves a resist image on top of the surface where light exposure has taken place and no resist on the surface where the resist has been removed by washing with the solvent. Thereafter, the substrate is soaked in a concentrated solution of silver nitrate wherein the silver salt is held by the absorptive surface not coated by the resist. This silver salt is then reduced to metallic silver by treatment with a suitable reducing agent. The photoresist is then removed by treatment with an appropriate solvent leaving the desired silver image in the absorptive medium. This silver metal deposit acts as a catalyst for subsequent electroless plating. It should be noted that in accordance with the teachings of this patent, the silver nitrate is held only in those areas where the resist has been washed off and is not absorbed by and does not coat the photoresist layer which is left on the specimen. In essence, the resist layer acts as a poison for the deposition of the silver nitrate.

In another method used in the prior art, a pattern of resist is laid down on an insulating substrate. The entire surface, including both resist and exposed substrate areas, is treated and coated with a sensitizer and an activator, and then the entire surface is treated with a metal deposition solution. Metal deposits both on the substrate and on the resist-covered areas and the resist with its electrolessly deposited metal coating is later removed by means of a solvent to leave only the metal pattern on the substrate, removing the metal pattern that overlies the resist upon removal of the resist. In this method, because of the relatively heavy formation of metal over the resist area, the edges of the conductors have a tendency to be ragged and hence resolution is not as good as required for some uses.

Still another electroless deposition method involves first sensitizing and activating the entire substrate surface before putting down a resist pattern. Then, after putting down the resist pattern, the entire surface is treated with the electroless metal deposition solution. In this method, metal deposits only on the sensitized and activated exposed substrate areas and not on the resist-covered areas. Resolution is quite good in this method, however, this method has serious disadvantages, e.g., (1) in that sensitization and activation of the substrate surface produces a surface which may have a relatively low resistivity between the deposited conductors and if spacing is to be very close, as is required in many of today's applications, this may cause electrical breakdown, and (2) manufacturing handling problems in that the catalytic surface is highly sensitive to contamination, scratching and the like which can result in defective circuits.

Still another means for forming the circuit pattern on a substrate is by the well known subtractive method wherein the substrate employed has a thin metal layer laminated to its surface. A positive photoresist pattern is then formed over the metal laminate and the laminate is then treated with an etching solution so as to etch the exposed portions of the metal laminate leaving metal only in the area protected by the photoresist. This method has several disadvantages among which is the necessity for the use of relatively large quantities of etching solution, undercutting of the metal during etching which prevents formation of high resolution patterns and the waste of base metal which must be etched away and either reclaimed or discarded.

It is therefore desirable to employ a method for forming a metal pattern on a insulating substrate for the purpose of manufacturing printed circuit boards wherein a high resolution pattern can be obtained without lowering the resistivity of the surface between conductive paths by means of a wholly additive technique so that there is no or little waste of metal involved in the process and large amounts of etchant solutions are not required.

SUMMARY OF THE INVENTION

I have found that a pattern of metal can be applied to a substrate in a wholly additive process which pattern can be of high resolution and which does not result in unwanted lowering of the surface resistance of the substrate between pattern lines and can minimize handling problems. The method comprises applying a removable negative mask onto a surface of the substrate whereby portions of the surface are exposed to form a positive circuit pattern, sensitizing the circuit pattern portions and the negative mask to form thereon a catalytic species capable of catalyzing an electroless metal deposition, removing the negative mask and thereby the catalytic species thereon to delineate the catalytic species and the circuit pattern on the surface and electrolessly depositing a metal onto the delineated catalytic species in the circuit pattern.

I have also found a preferred variation of the above method wherein after sensitization of the surface and before removing the mask, there is applied a thin flash metal electroless plating (e.g., Cu or Ni) over the catalytic layer. After the formation of this layer, the mask is removed together with any catalyst and flash plate overlying it. Finally, a desired metal is then electrolessly deposited onto the remaining portions of the flash plated surface pattern (the desired circuit pattern).

DETAILED DESCRIPTION

Figure 1:
FIGS. 1(a) through 1(e) are cross-sectional views illustrating successive steps in making a printed circuit board in accordance with the method of the present invention.
Figure 1:
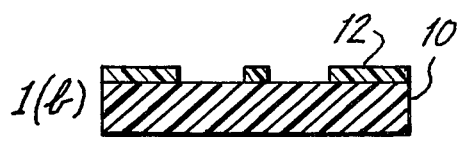
Figure 1:
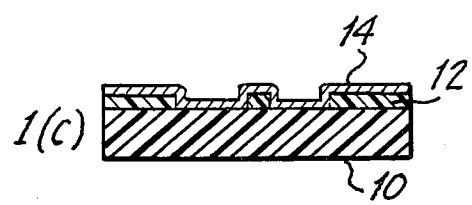
Figure 1:
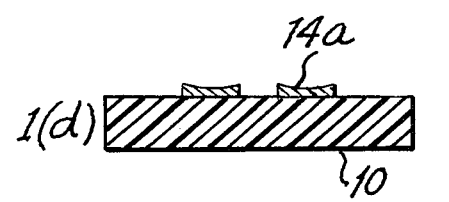
Figure 1:
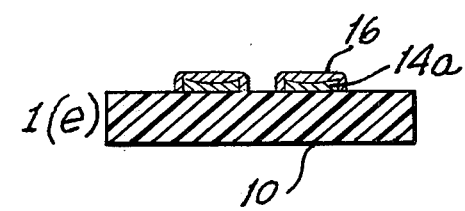

The process of the invention can be employed for many applications where a patterned metal layer is to be applied to an insulating substrate, but will be illustrated in detail with reference to the manufacture of a printed wiring board. Such printed wiring board may be of the rigid or flexible type. Furthermore, the present invention will be discussed primarily in terms of selectively depositing copper on a surface of an insulating substrate. It will also be readily appreciated that the inventive concept is equally applicable to depositing other suitable metals.

In accordance with the present invention, a negative mask is applied to a surface of a suitable substrate. Typically, the mask is of the photoresist type whereby portions of the substrate surface are exposed in a positive circuit pattern while the remaining portion of the substrate is covered by the photoresist mask. Thereafter, it is preferred to treat the exposed surfaces such as with chromic acid, so as to form micropores at least in the circuit pattern portions of the surface. This results in increased adhesion of the catalytic layer and copper layer to be formed over the surface. By forming the micropore surface subsequent to applying the resist rather than prior thereto, one can achieve a saving in the amount of chromic etchant required. Furthermore, the subsequent aesthetic or cosmetic appearance of the surface of the printed wiring board is enhanced. The surface of both the circuit pattern and the negative mask is then sensitized to form thereon a catalytic species capable of catalyzing an electroless metal deposition. The mask is then removed by means of an appropriate solvent, and with it, the catalytic species thereon, to delineate the catalytic species in the circuit pattern which remains on the substrate surface. Thereafter, a desired metal is electrolessly deposited to full thickness onto the delineated catalytic species in the circuit pattern. I have found that by removing the negative photoresist and catalytic layer thereon prior to electroless plating, the problem of raggedness of the edges sometimes found when the photoresist is removed subsequent to plating can be substantially reduced, thereby resulting in the possibility of obtaining higher resolution circuit patterns. Moreover, when the electroless layer becomes too thick or dense it may become difficult and even impossible to remove the resist thereunder. In a variation of the present invention, this flash electroless layer is applied over the first photoresist layer and catalyst thereon prior to stripping of the resist. The photoresist layer, catalyst and flash plate thereover are then removed leaving a positive circuit pattern consisting of catalyst and flash electroless metal. The surface is then treated with an electroless plating solution so as to plate metal only over the desired circuit pattern. It has unexpectedly been found that a very thin flash plate, e.g., about 0.003 to about 0.02 mil, results in a circuit image that is extremely stable and which can be stored indefinitely prior to electroless plating. The same process, without the thin flash plate results in a catalytic image which after a time, e.g., several days, loses its ability to catalyze electroless plating. This flash plate thickness should be thick enough to increase the stability of the catalytic image but yet must be thin enough to be porous and allow stripping of the underlying resist layer without the formation of substantially jagged edges of the remaining pattern upon lift-off.

In the practice of the invention a suitable substrate is first selected. Typical suitable substrates include bodies comprising inorganic and organic substances such as glass, ceramics, porcelain, resins, paper, cloth and the like.

For printed circuits, among the materials which may be used as the basis may be insulating thermosetting resins, thermoplastic resins and mixtures of the foregoing, including fiber, e.g., fiberglass, impregnated embodiments of the foregoing.

Included in the thermoplastic resins are acetyl resins; acrylics, such as methacrylate; cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile-styrene copolymers and acrylonitrile-butadiene styrene copolymers; polycarbonates; polychlorotrifluoroethylene; and vinyl polymers and copolymers, such as vinyl acetate, vinyl alcohol, vinyl butyral, vinyl chloride, vinyl chloride acetate copolymer, vinylidene chloride and vinyl formal.

Among the thermosetting resins may be mentioned allyl phthalate; furane; melamine formaldehyde; phenol formaldehyde; and phenol furfural copolymers, alone or compounded with butadiene acrylonitrile copolymers or acrylonitrile-butadiene styrene copolymers; polyacrylic esters; silicones; urea formaldehyde; epoxy resins; allyl resins; glycerol phthalates; polyesters; and the like.

The substrates may also comprise porous materials and fibers which have been impregnated with resins. The invention is particularly applicable to metallization of resin-impregnated fiber structures and varnish coated resin-impregnated fiber structures of the type described. A preferred substrate has been found to be a glass reinforced epoxy substrate commercially available as NEMA grade FR-4 available from NVF Corporation, EG-873-2102; Synthane Taylor FB-G20 and Norplex G10-FRA. Polyimide type substrates are also suitable.

After a suitable substrate is selected the substrate is drilled to form desired through holes and then, if needed, cleaned by known cleaning or scrubbing techniques in preparation for further processing.

A negative resist pattern is then formed over a surface of the substrate so as to delineate the desired circuit pattern in the areas not coated by the resist. The term resist, as used herein, includes any layer which can be applied to the surface of the substrate to form the desired negative pattern over which a catalytic layer can be formed which layer can be later removed by a solvent. Suitable resists include photoresists, inks and the like which are well known in the electroless plating and printed wiring board arts and are commercially available. The resist layer can be applied by any of the known techniques such as dip coating, spray coating, printing, laminating and the like. The resist pattern may be formed directly by well known printing techniques such as screen printing or by well known photoresist light exposure and development techniques. It is generally preferred for high resolution printed wiring boards, to form the pattern using a photoresist which is applied to the substrate surface, exposed through a mask to form an image of the desired pattern and then developed.

Depending upon the substrate surface, it may be desirable to form micropores in the surface such as by etching or swell-etching the surface. Swell-etching is generally achieved by first swelling the surface with a suitable solvent and then etching with a suitable etchant such as chromic acid or chromic acid based solutions in order to increase adhesion of the catalytic layer and electroless layer to be formed over the surface of the substrate and resist.

Subsequent to any etchant step and rinsing and neutralization of any etchant, the surface is then sensitized so as to form a catalytic layer thereon.

Essentially any of the well known and commercially available sensitizing solutions may be employed. Sensitization can be carried out for example by means of tin-palladium sensitizing solutions to form a palladium catalytic layer or by means of sensitization with a non-noble metal such as by the use of copper compounds such as cuprous oxide or copper formate which is then reduced by means of a reducing agent to form a catalytic copper metal layer. As aforesaid, sensitization of surfaces to form catalytic layers is well known in the art and therefore need not be discussed at length herein.

Generally, after sensitization, the substrate surface is rinsed and, depending upon the sensitizer used, it may be desirable to employ an accelerator or stabilizer solution to stabilize the catalytic layer. Such accelerators or stabilizers are also well known in the art. For example, suitable accelerators for Sn-Pd sensitizers are Metex 9071 sold by MacDermid Corporation, Accelerator 19 sold by Shipley or a cyanide solution.

In one embodiment of the novel invention, as shown in FIGS. 1(a)-1(e), the processing of the substrate 10 is shown. Here, resist layer 12 and the exposed substrate surface are exposed to an etchant and then the exposed surfaces are coated with a catalytic layer 14. The resist layer 12 together with the catalytic layer 14 deposited thereover are then stripped from the substrate 10 leaving only the catalytic layer 14 over the areas of the substrate 10 not coated by the resist 12. This results in a positive catalytic circuit pattern 14(a) on the substrate. The resists are generally stripped by means of solvents in which the particular resist is sufficiently soluble. Such solvent-resist combinations are well known in the art for the commercially available resists.

The substrate having the catalytic circuit pattern thereon is then treated in an electroless metal plating bath so as to form an electroless metal deposit 16 over the catalytic layer 14(a). Typically this deposit is about 1.3-1.4 mils thick. If desired, plating thickness may be built up by electroplating with plating tie-ins after initial electroless plating and further, if desired, portions of the circuit may be plated with other metals, such as gold, to enhance solderability or bondability of components thereon.

Figure 2:
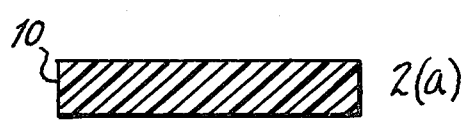
FIGS. 2(a) through 2(f) are cross-sectional views illustrating successive steps in making a printed circuit board in accordance with a variation of the method as shown in FIG. 1.
Figure 2:
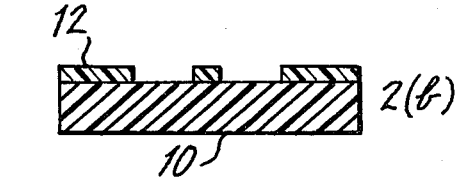
Figure 2:
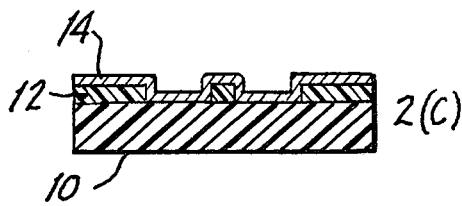
Figure 2:
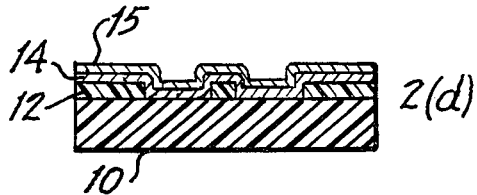
Figure 2:
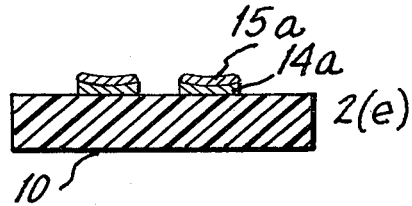
Figure 2:
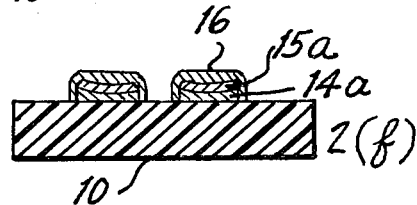

In a variation of the above method shown with reference to FIG. 2, rather than stripping the resist 12 and catalytic layer 14 thereon as aforesaid, a thin flash electroless copper layer 15 is applied over the first resist layer 12 and catalytic layer 14 so as to make the catalytic layer more robust and stable. This layer is typically 0.003 to 0.02 mil thick and is somewhat porous to allow for later removal of the resist. The resist 12 and overlying portions of catalytic layer 14 and flash coat 15 are then removed by treating with an appropriate solvent. For example, when the resist is DuPont RISTON 1215 or the like, a suitable solvent is methylene chloride. The substrate is then treated with an electroless plating bath, e.g., MacDermid 9620 or Photocircuits CC4 whereupon an electroless deposit 16 is formed over the exposed catalytic layer 14(a) to form the desired circuit pattern. These baths are of the $CuSO_4$-formaldehyde-NaOH-chelating agent type. One advantage of this technique as compared to the previously mentioned technique is the increased stability of the catalytic layer for the later promotion of a full thick electroless deposit without inhibiting the ability to readily remove the resist layer.

EXAMPLE I

An epoxy-glass substrate is drilled to form through holes. The substrate is then scrubbed to remove any drilled debris and the surface is cleaned prior to screen printing or resist deposition. A photoresist such as DuPont RISTON photoresist is applied to the surface of the substrate and then exposed to light through a mask to form a positive resist image. The image is then developed with trichloroethane thereby removing the unexposed resist. The substrate is then treated with an 86% aqueous solution of dimethylformamide at 30° C. to swell the exposed substrate surface. The swelled surface is dried and then etched for 5 minutes with moderate stirring at about 50° C. in a solution containing 100-105 grams/liter $CrO_3$ in dilute sulfuric acid. The etched substrate is rinsed, neutralized in a solution of sodium metafisulfite, rinsed again, and treated with a 20 volume percent solution of hydrochloric acid for about one minute. The substrate is then catalyzed using a commercially available, $SnCl_2$, $PdCl_2$, HCl solution such as MacDermid 9070 catalyst. The catalyzed surface is then rinsed first with water and then with about a one normal sodium hydroxide solution at 60° C. followed by a second water rinse. The photoresist is then stripped with methylene chloride, dried to remove any excess solvent and then plated with copper by immersion in an electroless copper plating bath such as one comprising copper sulfate, formaldehyde, tetrasodium ethylenediamine tetraacetic acid and sodium hydroxide. A suitable electroless bath is marketed by MacDermid under the designation 9620. The plated substrate can then be rinsed and dried.

EXAMPLE II

The process recited in Example I is repeated except that instead of applying a blanket coat of photoresist which is exposed to light and developed, an ink resist, such as MacDermid 9251 is applied by screen printing techniques in the form of the desired pattern thereby eliminating the steps of exposing and developing a photoresist.

EXAMPLE III

The substrate is treated in the same manner as set forth in Example I through the steps of catalyzing and rinsing with normal sodium hydroxide solution. Thereafter, the substrate is immersed in a flash electroless copper plate bath such as MacDermid 9085 or 9072-9073 to form a thin porous electroless copper deposit which is approximately 0.010 mil in thickness.

The resist is then stripped as set forth in Example I and the substrate rinsed and placed in an electroless plating bath such as MacDermid 9620 to achieve a full plate of approximately 1.35 mils thick copper plating. The substrate is then rinsed and dried.

What is claimed is:

1. A method of applying a patterned metal film onto a substrate comprising (1) applying a negative mask onto a surface of the substrate whereby portions of the surface are exposed in a positive pattern, (2) forming micropores in the positive pattern portions of the substrate surface, (3) sensitizing the positive patterned portions of the substrate and the negative mask to form thereon a catalytic species capable of catalyzing an electroless metal deposition, (4) electrolessly depositing a thin porous flash metal deposit having a thickness of from 0.003 to 0.020 mils onto the delineated catalytic species in the circuit pattern, (5) removing the negative mask and thereby the catalytic species and flash electroless metal deposit thereon to delineate the catalytic species and flash deposit in the positive pattern on the substrate surface, and (6) electrolessly depositing a metal onto the catalyzed positive pattern.

2. The method recited in claim 1 wherein said electroless deposit and said electroless flash deposit are both copper deposits.

* * * * *